United States Patent
Ochi et al.

(10) Patent No.: US 7,719,861 B2
(45) Date of Patent: May 18, 2010

(54) SIGNAL DIFFERENTIATION WITH DIFFERENTIAL CONVERSION CIRCUIT

(75) Inventors: Sam Ochi, Saratoga, CA (US); Don Humbert, Santa Clara, CA (US)

(73) Assignee: IXYS Corporation, Santa Clara, CA (US)

( * ) Notice: Subject to any disclaimer, the term of this patent is extended or adjusted under 35 U.S.C. 154(b) by 288 days.

(21) Appl. No.: 11/677,530

(22) Filed: Feb. 21, 2007

(65) Prior Publication Data

US 2007/0194831 A1    Aug. 23, 2007

Related U.S. Application Data

(60) Provisional application No. 60/776,029, filed on Feb. 22, 2006.

(51) Int. Cl.
*H02M 7/538* (2007.01)
(52) U.S. Cl. ............... 363/24; 363/25; 363/133; 363/134
(58) Field of Classification Search .......... 363/17, 363/58, 98, 95, 132, 136, 24, 25, 133, 134
See application file for complete search history.

(56) References Cited

U.S. PATENT DOCUMENTS

| | | | |
|---|---|---|---|
| 4,344,124 A | | 8/1982 | Kalfhaus |
| 6,389,063 B1 | | 5/2002 | Kanekawa et al. |
| 6,804,129 B2 * | | 10/2004 | Lin .................. 363/98 |
| 6,943,434 B2 | | 9/2005 | Tangpuz et al. |
| 6,958,919 B1 * | | 10/2005 | Kung .................. 363/17 |
| 7,200,012 B1 * | | 4/2007 | Hsu .................... 363/17 |
| 7,310,245 B2 * | | 12/2007 | Ohbo ................ 363/21.02 |
| 2003/0123398 A1 | | 7/2003 | Senuma |
| 2005/0128772 A1 * | | 6/2005 | Choi et al. ........... 363/17 |
| 2005/0146290 A1 | | 7/2005 | Gray |

OTHER PUBLICATIONS

International Search Report for International Application No. PCT/US07/62604, dated Feb. 27, 2008 (2 pages).
Schmidt-Walter, et al., "*Full Bridge Push Pull Converter, Updated 2006*", [retrieved on Sep. 27, 2007]. Retrieved from the Internet <URL:http://Schmidt-walter.fbe.fh-darmstadt.de/smps_e/vgw_smps_e.html>.
Bigelow, "*CMOS Logic*", Copyright 1996, 2000, 2007 [retrieved on Sep. 27, 2007], Retrieved from the Internet <URL:http://www.playhookey.com/digital/electronics/cmos_gates.html>.

* cited by examiner

*Primary Examiner*—Bao Q Vu
*Assistant Examiner*—Nguyen Tran
(74) *Attorney, Agent, or Firm*—Townsend and Townsend and Crew LLP

(57) ABSTRACT

A circuit for transmitting signals includes a transformer having an input side and an output side, the input side having a first end and a second end. A first transistor is coupled to the first end of the transformer, the first transistor being configured to provide a first signal to the first end in response to an input signal transitioning to a first state. A second transistor is coupled to the second end of the transformer; the second transistor being configured to provide a second signal to the second end in response to the input signal transitioning to a second state. The output side is configured to output differential signals according to the first and second signals applied to the transformer.

12 Claims, 5 Drawing Sheets

SIGNAL DIFFERENTIATION WITH DIFFERENTIAL CONVERSION CIRCUIT

CROSS-REFERENCES TO RELATED APPLICATIONS

The present invention claims benefits of U.S. Provisional Application No. 60/776,029, filed on Feb. 22, 2006, which is incorporated by reference.

BACKGROUND OF THE INVENTION

The present invention relates to a circuit for transmitting signals across a magnetic boundary.

Semiconductor power devices of various types are used in electronic and electrical devices to operate them. For example, power MOSFETs or IGBTs are used to supply power to such electronic or electrical devices. These power MOSFETs and IGBTs, in turn, are controlled by gate drivers that are coupled to the gates of the power MOSFETs and IGBTs.

The potential difference between the input side and the output side is generally 3-20 volts. However, the required voltage isolation capacity tends to be very large in certain applications, e.g., 3750 volts or more, to protect against sudden spikes or fault conditions. Accordingly, the input side and the output side are isolated from each other using various different techniques. One method is to use a transformer as an interface between the input and output sides. Such a transformer requires one or more magnetic components and windings.

In the past, the transformer tended to be bulky and was placed external to a packaged gate driver. Recently, a packaged gate driver including a magnetic component has been disclosed. One such a gate driver is disclosed in U.S. patent application Ser. No. 11/329,934, filed on Jan. 10, 2006, which is incorporated by reference. One or more magnetic components are included within the package to provide a smaller footprint and more designing flexibility to engineers. However, the magnetic components included within the package would need to be significantly smaller than those used for the conventional transformers.

BRIEF SUMMARY OF THE INVENTION

The present invention relates to a circuit for transmitting signals. In one embodiment, the circuit is provided within a packaged device including a magnetic component, e.g., a transformer. The packaged device may be a gate driver or other semiconductor power devices. In the present implementation, the pulse width and/or duty cycles are used to transfer signals to the output side of the transformer as differential signals.

Embodiments of the present invention use short-time (or short-pulse) duration signals and/or differential inputs to a transformer to prevent the saturation of the transformer. This enables the use of a significantly smaller-sized transformer than otherwise possible. The circuit transmits primarily the edge transition information from the input side of the transformer to the output side of the transformer. A differential signal is obtained at the output side of the transformer using the edge transition information. This eliminates the frequency dependence between the input signal and the signal transmission. The differential signal, converted from the input signal differentiation at the input side of the transformer, is read by a comparator on the output side of the transformer T1 to drive a power MOSFET or power IGBT in the present embodiment. In other embodiments, the differential signal may be used by other devices for other purposes.

A circuit according to present embodiments has one or more of the following advantages. The circuit eliminates the use of a coupling capacitor, thereby preventing DC signal content from saturating the magnetic component. The circuit minimizes magnetic size by using a differentiated signal with only high frequency content to extract transition information from a duty cycle modulated input signal. The circuit allows transmission of DC to MHz signals without significantly increasing the size of magnetic element, thus allowing the use of a small magnetic component that may be included in a packaged device.

In one embodiment, a circuit for transmitting signals includes a transformer having an input side and an output side, the input side having a first end and a second end. A first transistor is coupled to the first end of the transformer, the first transistor being configured to provide a first signal to the first end in response to an input signal transitioning to a first state. A second transistor is coupled to the second end of the transformer; the second transistor being configured to provide a second signal to the second end in response to the input signal transitioning to a second state. The output side is configured to output differential signals according to the first and second signals applied to the transformer.

In one embodiment, the circuit further comprises a third transistor coupled to the first transistor, the first and third transistors provided in a half bridge configuration. A fourth transistor is coupled to the second transistor, the second and fourth transistors provided in a half bridge configuration. The first and the second transistors are p-type MOSFETs, and the third and fourth transistors are n-type MOSFETs. The circuit is part of a gate driver.

In one embodiment, the circuit comprises a comparator that is configured to receive the differential signals outputted on the output side of the transformer and generate a gate drive signal to drive a power device. The gate driver is a packaged gate driver that includes the transformer, the first and second transistors, and the comparator. The circuit is configured to transmit primarily an edge transition information from the input side of the transformer to the output side of the transformer. The circuit is configured to use differential inputs to the transformer to generate the differential signals at the output side of the transformer.

In one embodiment, the first transistor has one end grounded and the other end coupled to the first end of the transformer, and the second transistor has one end grounded and the other end coupled to the second end of the transformer.

In another embodiment, a circuit for transmitting signals includes a transformer having an input side and an output side, the input side having a first end and a second end; a first input voltage supply configured to generate a first input signal; a second input voltage supply configured to generate a second input signal; a first transistor coupled to the first end of the transformer, the first transistor being configured to provide a first signal to the first end in response to the first input signal transitioning to a first state; and a second transistor coupled to the second end of the transformer; the second transistor being configured to provide a second signal to the second end in response to the second input signal transitioning to a second state, wherein the output side is configured to output differential signals according to the first and second signals applied to the transformer.

$$V_P(t) \cong V_{inpk} * e^{\left(\frac{-t}{n^2 * R_L * C_{in}}\right)}\bigg|_{\substack{t_{H0}<t<t_{L0},\\ t_{H1}<t<t_{L1}}}, \quad V_P(t) \cong -V_{inpk} * e^{\left(\frac{-t}{n^2 * R_L * C_{in}}\right)}\bigg|_{\substack{t_{L0}<t<t_{H1}\\ t_{L1}<t<t_{H2}}}$$

$$V_S(t) \cong \frac{V_{inpk}}{n} * e^{\left(\frac{-t}{n^2 * R_L * C_{in}}\right)}\bigg|_{\substack{t_{H0}<t<t_{L0},\\ t_{H1}<t<t_{L1}}}, \quad V_S(t) \cong \frac{-V_{inpk}}{n} * e^{\left(\frac{-t}{n^2 * R_L * C_{in}}\right)}\bigg|_{\substack{t_{L0}<t<t_{H1}\\ t_{L1}<t<t_{H2}}}$$

Figure 5A:
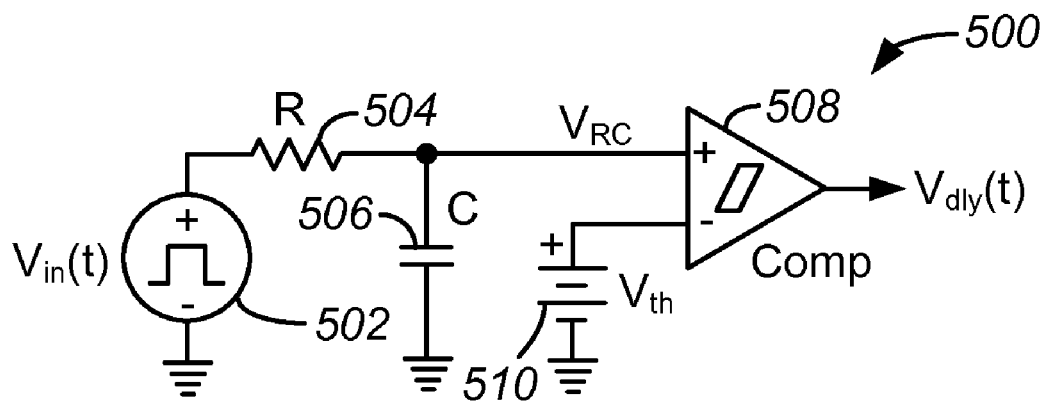

FIG. 5A illustrates a delay component according to one embodiment of the present invention.

Figure 5B:
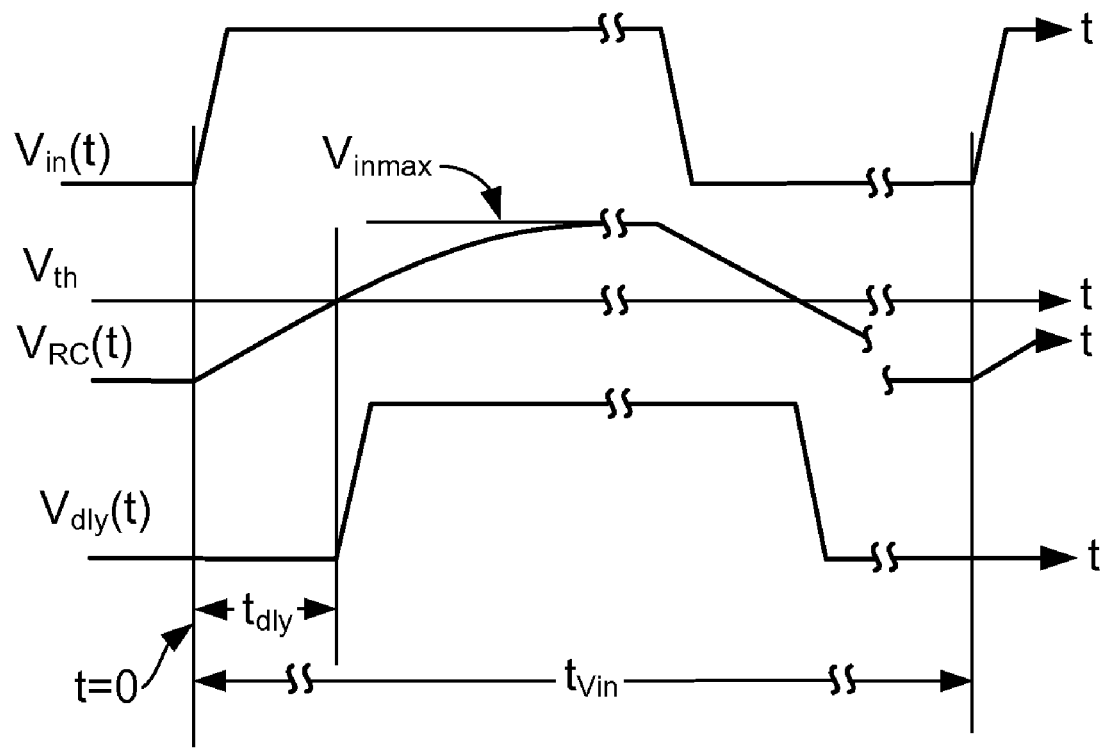

FIG. 5B illustrates a plurality of timing diagrams associated with the delay component of FIG. 5A.

Figure 6A:
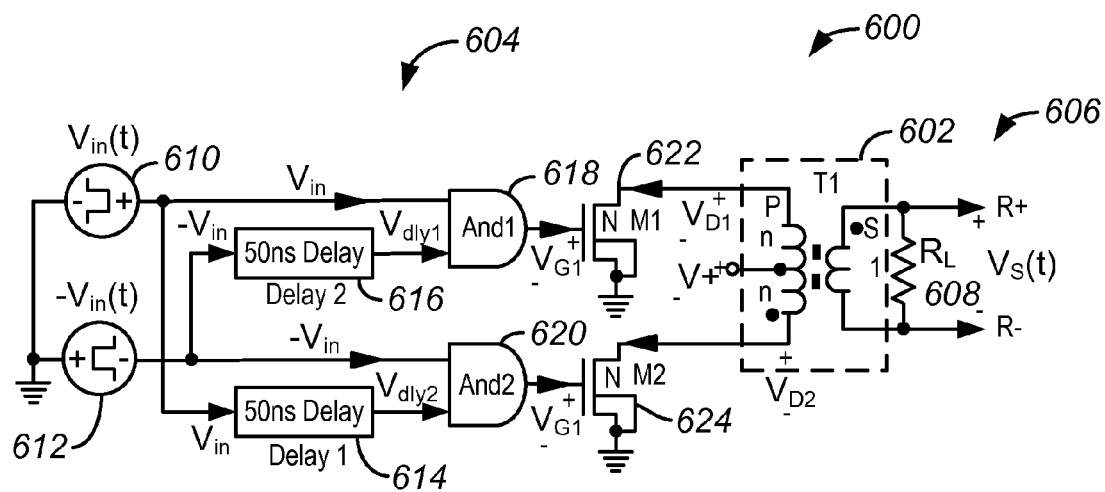

FIG. 6A illustrates a circuit for transmitting signals according another embodiment of the present invention.

Figure 6B:
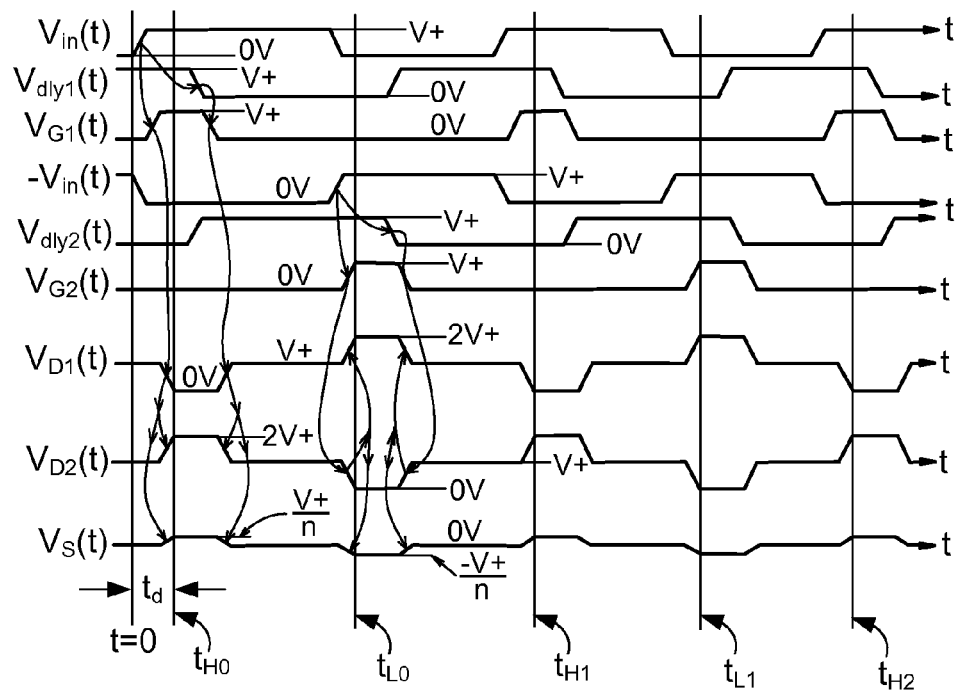

FIG. 6B illustrates a plurality of timing diagrams associated with the circuit of FIG. 6A.

Figure 7A:
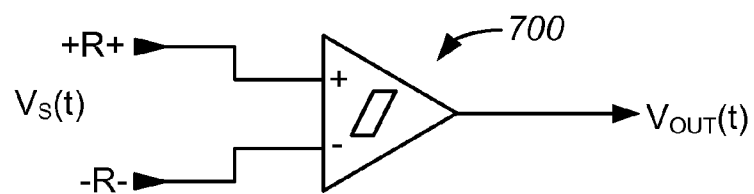

FIG. 7A illustrates a comparator configured to read the differential signal provided on the output side of the transformer according to one embodiment of the present invention.

Figure 7B:
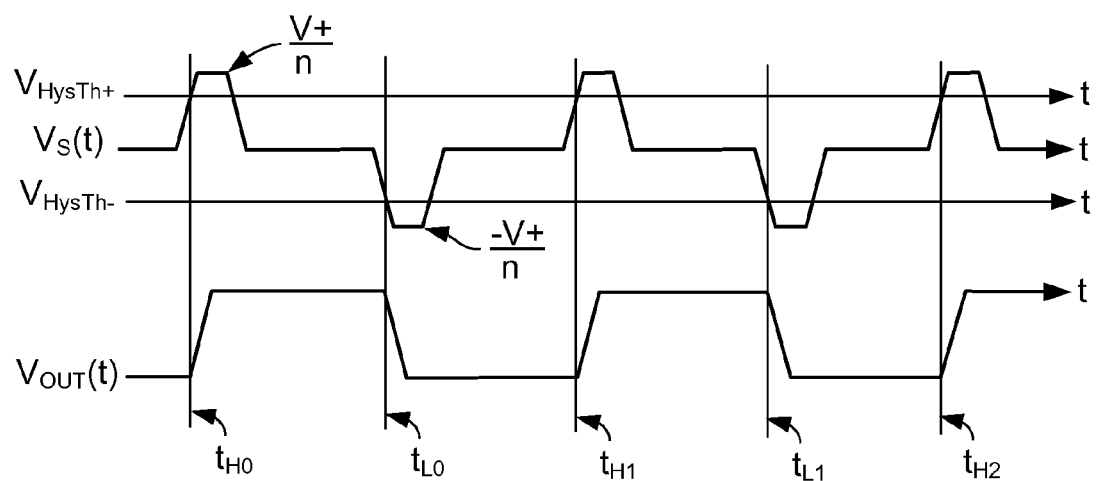

FIG. 7B shows a plurality of timing diagrams associated with the comparator of FIG. 7A.

DETAILED DESCRIPTION OF THE INVENTION

The present invention relates to a circuit for transmitting signals. The circuit is provided within a packaged device including a magnetic component in one embodiment. The present invention is illustrated in the context of a gate driver. However, the invention is not limited to such an application. The invention may be used to transmit various signals across a magnetic component, e.g., a transformer. In one embodiment, the circuit is used to transmit binary information using the pulse width and/or duty cycles of input signals.

Embodiments of the present invention use short-time (or short-pulse) duration signals and/or differential inputs to a transformer to prevent the saturation of the transformer. This enables the use of a significantly smaller-sized transformer than otherwise possible. The circuit transmits primarily the edge transition information from the input side of the transformer to the output side of the transformer. A differential signal is obtained at the output side of the transformer using the edge transition information. This eliminates the frequency dependence between the input signal and the signal transmission. The differential signal, converted from the input signal differentiation at the input side of the transformer, is read by a comparator on the output side of the transformer T1 to drive a power MOSFET or power IGBT in the present embodiment. The differential signal, however, may be used by other devices for other purposes.

Figure 1:
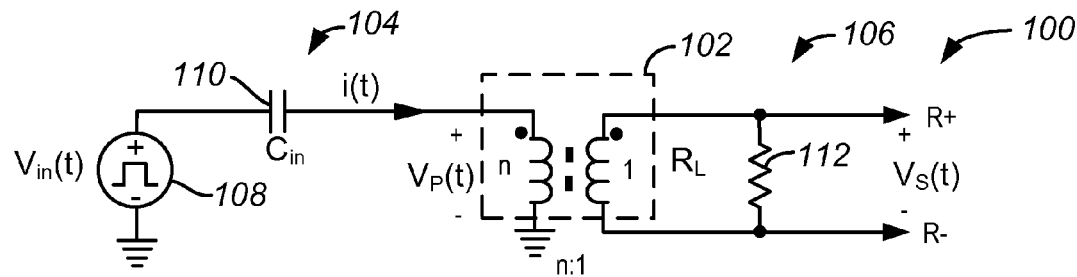
FIG. 1 illustrates a conventional circuit for transmitting signals.
Figure 2:
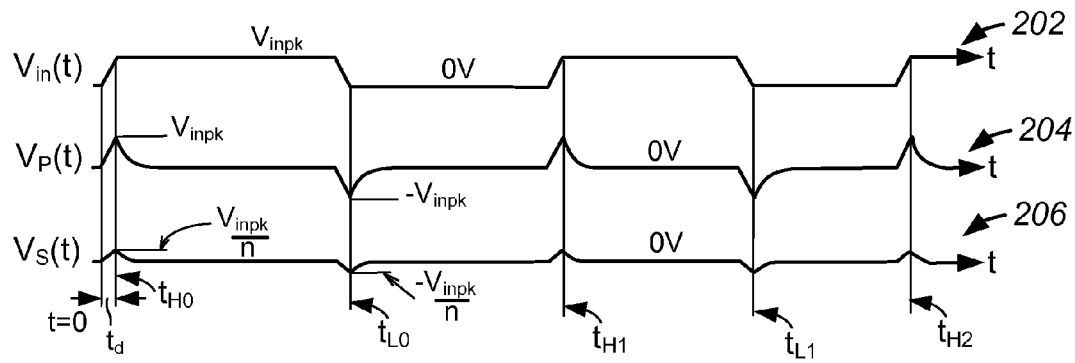
FIG. 2 illustrates a plurality of timing diagrams associated with the circuit of FIG. 1.

FIG. 1 illustrates a conventional circuit 100 for transmitting signals. The circuit includes a transformer 102 provided between an input side 104 and an output side 106. The input side of the transformer 102 has a potential of $V_P(t)$. The input side includes a voltage supply 108 to provide an input signal $V_{in}(t)$ and a capacitor ($C_{in}$) 110. A current i(t) is applied to the transformer 102 according to the input signal applied to the capacitor 110. The output side 106 includes a load resistor ($R_L$) 112 that defines a voltage $V_S(t)$ across it, which is output as a signal. The values of the voltages are defined as follows:

FIG. 2 illustrates a plurality of timing diagrams associated with the circuit 100 of FIG. 1. A timing diagram 202 shows the input signal $V_{in}(t)$. A timing diagram 204 shows the voltage $V_P(t)$ across the input side of the transformer. A timing diagram 206 shows the voltage $V_S(t)$ across the load resistor 112. The voltages $V_P(t)$ and $V_S(t)$ mirror the input voltage $V_{in}(t)$. As shown in FIGS. 1 and 2, the circuit 100 including the coupling capacitor 110 causes the transformer 102 to receive the DC signal content. As a result, the transformer 102 needs to be of relatively large to prevent it from being saturated prematurely. Such a transformer may be too big to be included in a packaged device, e.g., a packaged gate driver.

Figure 3:
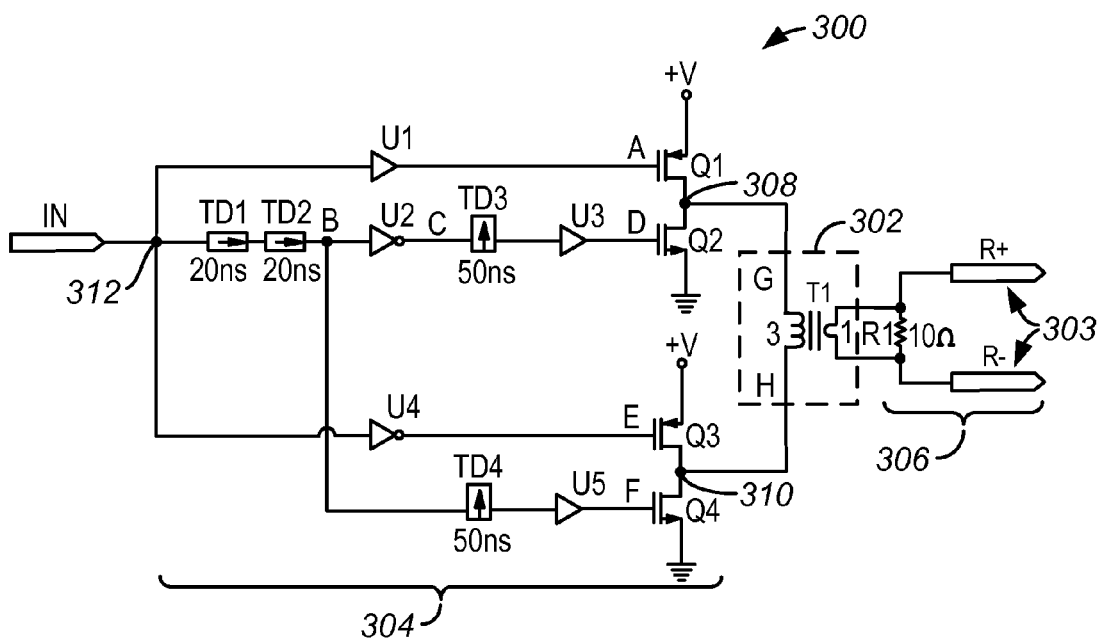
FIG. 3 illustrates a circuit for transmitting a differential signal across a magnetic component according to one embodiment of the present invention.

FIG. 3 illustrates a circuit 300 for transmitting a differential signal across a magnetic component according to one embodiment of the present invention. A magnetic component 302 is provided between an input side 304 and an output side 306. The circuit 300 is configured to use signal differentiation at the input side. In the present embodiment, the magnetic component 302 is a transformer with 3:1 step-down ratio. That is, the signal outputted by the transformer would have amplitude that is ⅓ of V+.

The output side 306 includes an impedance load resistor R1 and configured to output a differential signal 303, represented by V(R+-R−). The impedance load resistor R1 is configured to provide noise resistance and has resistance of 10 ohms in the present embodiment. The differential signal V(R+-R−) 303 may be used to control or drive other devices. In one embodiment, the differential signal 303 is used to generate a signal to drive the gate of a power MOSFET (not shown) via a comparator (see FIG. 7).

The input side 304 includes four transistors Q1, Q2, Q3, and Q4, in two half bridge (or totem pole) configurations. First and second transistors Q1 and Q2 define a first totem pole drive stage between V+ and the ground. The first transistor Q1 is a PMOSFET, and the second transistor is an NMOSFET. A first node 108 provided between the first and second transistors Q1 and Q2 is connected to one end (or node G) of the transformer 102.

Similarly, third and fourth transistors Q3 and Q4 define a second totem pole drive stage between V+ and the ground. The third transistor Q3 is a PMOSFET, and the fourth transistor is an NMOSFET. A second node 310 provided between the third and fourth transistors Q3 and Q4 is connected to another end (or node H) of the transformer 102.

An input node 312 receives an input signal IN that is used to drive the transistors Q1, Q2, Q3, and Q4. A first buffer U1 is provided between the input node 312 and the gate (or node A) of the first transistor to drive the first transistor. The first buffer U1 is a non-inverting buffer.

First and second delay components TD1 and TD2 are provided between the input node 312 and a node B. The first and second delay components TD1 and TD2 are Type 1-Type2 delay circuits in the present embodiment. The first and second delay components TD1 and TD2 are configured to provide a delay of 40 ns in the present embodiment. A second buffer U2, a third delay component TD3, and a third buffer U3 are provided between the node B and the gate (or node D) of the second transistor. The second buffer U2 is an inverting buffer, and the third buffer U3 is a non-inverting buffer. The third delay component TD3 is a Type 3 delay circuit and configured to provide a delay of 50 ns in the present embodiment. A node C is defined between the second buffer U2 and the third delay component TD3.

A fourth buffer U4 is provided between the input node 312 and the gate (or node E) of the third transistor Q3. The fourth buffer is an inverting buffer.

A fourth delay component TD4 and a fifth buffer U5 are provided between the node B and the gate (or node F) of the fourth transistor. The fourth delay component TD4 is a Type 3 delay circuit and configured to provide a delay of 50 ns in the present embodiment. The fifth buffer U5 is a non-inverting buffer.

Figure 4:
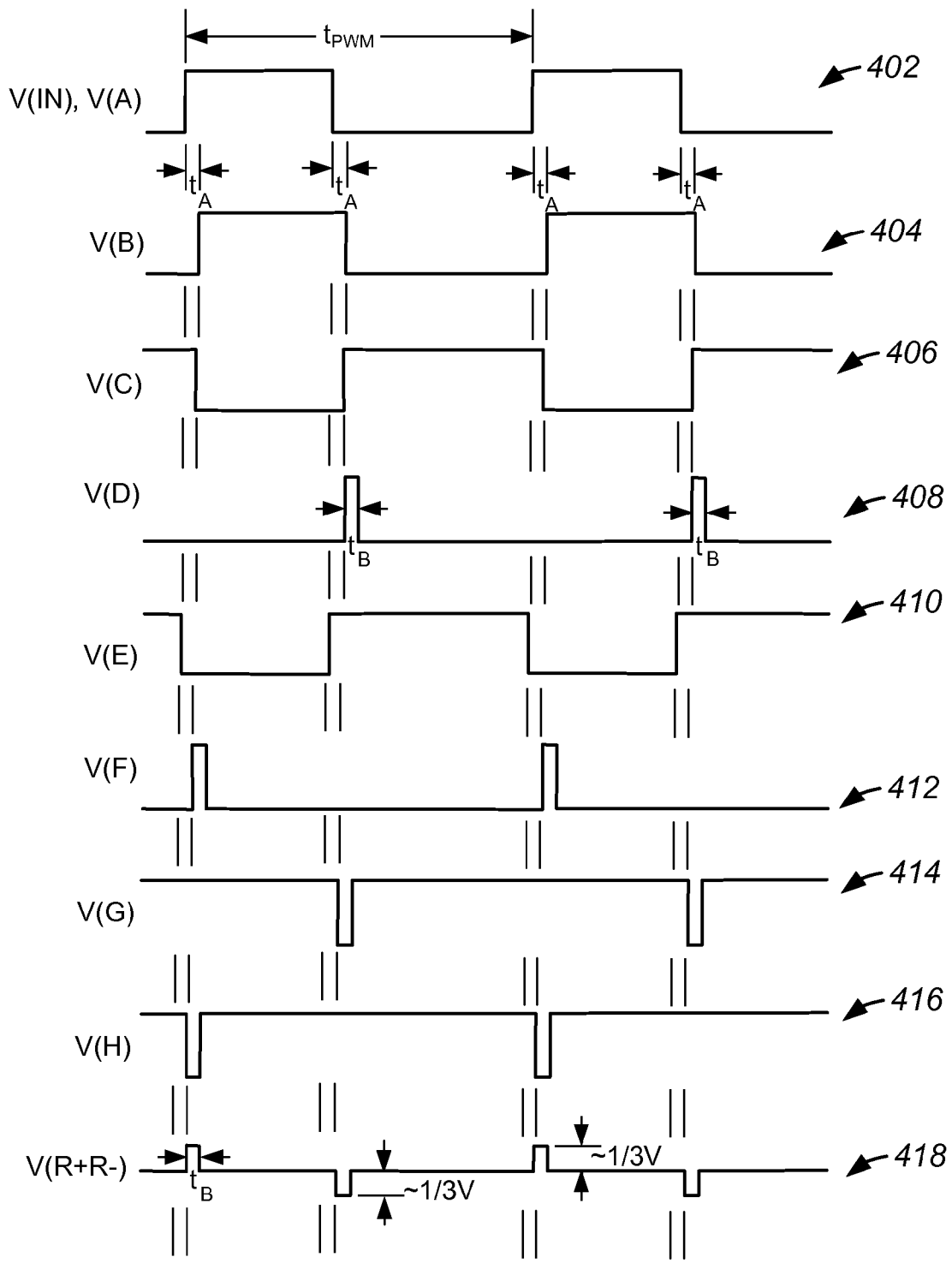
FIG. 4 illustrates a plurality of timing diagrams associated with the circuit of the FIG. 3 according to one embodiment of the present invention.

FIG. 4 illustrates a plurality of timing diagrams associated with the circuit 300 of the FIG. 3 according to one embodiment of the present invention. A timing diagram 402 illustrates an input signal V(IN) and the signal V(A) as seen at the node A. A timing diagram 404 illustrates the signal V(B) as seen at the node B. A timing diagram 406 illustrates the signal V(C) as seen at the node C. A timing diagram 408 illustrates the signal V(D) as seen at the node D. A timing diagram 410 illustrates the signal V(E) as seen at the node E. A timing diagram 412 illustrates the signal V(F) as seen at the node F. A timing diagram 414 illustrates the signal V(G) as seen at the node G. A timing diagram 416 illustrates the signal V(H) as seen at the node H. A timing diagram 418 illustrates the differential signal V(R+-R-) as seen at the output side 306.

FIG. 5A illustrates a delay component 500 according to one embodiment of the present invention. The delay component 500 includes a voltage supply 502, a resistor 504, a capacitor 506, a comparator 508, and a voltage source 510. FIG. 5B illustrates a plurality of timing diagrams associated with the delay component 500. As shown, the time delay may be controlled by adjusting the values of the resistance of the resistor 504 and the capacitance of the capacitor 506.

In operation, an input signal IN or V(IN) is differentiated by the circuit 300 and transmitted as a differential signal across a magnetic boundary (or transformer). Differentiation is obtained by the way the input signal is introduced to the first totem pole drive stage Q1 and Q2 and the second totem pole drive stage Q3 and Q4 in an alternate manner. This limits the transformer from receiving the DC signal content.

The input signal is fed to the PMOSFET Q1 through the first buffer without inversion and to the PMOSFET Q3 through the fourth buffer U4 with inversion. An input signal LOW turns on the first transistor Q1 and applies a voltage of 5 volts (or V+) to the dotted side (i.e., at the node G) of the transformer T1. The input signal LOW turns off the third transistor Q3 due to the inversion at the fourth buffer U4. The undotted side (i.e., at the node H) of the transformer T1 sees high impedance.

An input signal HIGH inverts above situation outside of the signal transition regions. The first transistor Q1 is turned off and provides high impedance to the node G. At this period, the first totem pole drive stage is configured to provide ultra-low leakage current with respect to +V and the transformer T1. The third transistor Q3 is turned on and provides V+ to the node H.

With respect to the ground signal in the totem poles, the second and fourth transistors Q2 and Q4 are normally kept turned off. This enables only one of the nodes G and H to be connected to +V and the other side to a high impedance connection.

The second and fourth transistors Q2 and Q4 are operated to create a momentary ground connection that acts to generate a short pulse signal in response to the edge transitions of the input signal. This is a leading edge (or positive transition, low to high signal transition) differentiated signal on V(H), with High to Low transitions between +V and Ground (approximately, minus MOSFET saturation voltages) aligned with "positive going" input signal transitions. It also includes a lagging edge (low transition, high to low signal transition) differentiated signal on V(G), with High to Low transitions between +V and Ground (again approximately, minus MOSFET saturation voltages) aligned with "negative going" input signal transitions.

These V(G) and V(H) differentiated signals are delayed by a given period (e.g., 20 ns) with respect to the actual signal transitions, $t_A$ in FIG. 4. The delay is created by passing the input signal IN through a Type 1-Type 2 cascode delay circuit of 20 ns that delays the leading and lagging edges of the input signal. This delay shifts the turn-on of the second and fourth transistors Q2 and Q4 that connect the nodes G and H to the ground, thereby shifting the low transition points for the V(G) and V(H) signals with respect to the actual input signal V(IN) by that same time. The delay is used to complete the transition of the input signal, to allow the first and third transistors Q1 and Q3 to reach the proper state, and to prevent shoot-through currents on activation of the second or fourth transistor Q2 or Q4 for signal grounding purposes.

The duration of the V(G) and V(H) signal inputs is controlled by the third and fourth delay components TD3 and TD4, which generate a short-time duration signal to keep the actual time duration of the signal small to minimize the transformer size. This also eliminates frequency dependence between the input signal and the transmission signal and the dependence of the magnetic size on the frequency of the transmission signal. The third and fourth delay components TD3 and TD4 are Type 3 delay circuits in the present embodiment.

A Type 3 time delay circuit generates a specified signal in response to the assigned input logic, e.g., a positive going signal dependence which generates a 50 ns pulse per FIG. 3 after a positive signal edge transition. The third delay component TD3 is driven by a signal V(C), which is a time delayed (e.g., 20 ns) inverted signal with respect to V(IN). The output of the third delay component TD3 grounds V(G) via the second transistor Q2 on negative transitions of V(IN) as shown by V(D). The fourth delay component TD4 is driven by a time delayed (e.g., 20 ns) non-inverted signal with respect to V(IN). The output of the fourth delay component TD4 grounds V(H) via the fourth transistor Q4 on positive transitions of V(IN) as shown by V(F).

In one embodiment, a combination of short-time (or short-pulse) duration signals and differential inputs to the transformer T1 via the nodes G and H are used to prevent the saturation of the transformer T1. This enables the use of a significantly smaller-sized transformer than otherwise possible. Also, the method and circuit above transmits primarily the edge transitions, thereby eliminating the frequency dependence between the input signal and the signal transmission. The edge transition information is coupled across the transformer T1 via the short-time duration signals into a low impedance load resistor (R1) for noise immunity. A differential signal 218 between R+ and R− is obtained as a result of the lagging edge information that is transferred via the grounding of V(G) and leading edge information that is transferred via the grounding of V(H).

The differential signal V(R+-R−) is read by a high speed comparator 700 connected to R+ and R− and operated on the output side of the transformer T1, as shown in FIG. 7A. FIG. 7B shows a plurality of timing diagrams associated with the comparator 700 of FIG. 7A. By changing the output state of the comparator in response to the edge transitions communicated across the transformer T1, the input signal IN is reproduced at the output side of the transformer T1 without concern for the actual frequency or the need to for extra capacitors or overly large magnets that would otherwise be needed to prevent saturation with long duration input signals.

FIG. 6A illustrates a circuit 600 for transmitting signals according another embodiment of the present invention. A transformer 602 is provided between an input side 604 and an output side 606. The output side 606 includes a load resistor 608 and configured to output differential signals. The input side 604 includes a first voltage supply 610 configured to output $V_{in}(t)$ and a second voltage supply 612 configured to output $-V_{in}(t)$. A first delay component 614 is coupled to the first voltage supply 610, and a second delay component 616 is coupled to the second voltage supply 612. A first logic gate (e.g., AND gate) 618 is coupled to the first supply voltage 610 and the second delay component 616. A second logic gate (e.g., AND gate) 620 is coupled to the second supply voltage 612 and the first delay component 614. The gate of a first transistor 622 is coupled to the first logic gate 618. The gate of a second transistor 624 is coupled to the second logic gate 620. Each end of the input side of the transformer 602 is coupled to the first and second transistors, respectively. FIG. 6B illustrates a plurality of timing diagrams associated with the circuit 600. As shown, the differential signals V(S) on the output side of the transformer 602 with a time delay from the input signal.

The present invention has been described in terms of the specific embodiments. As will be understood by those skilled in the art, the embodiments illustrated above may be modified or changed without departing from the scope of the present invention. For example, the delay components may be provided with different delay times. The scope of the present invention should be interpreted using the appended claims.

What is claimed is:

1. A circuit for transmitting signals, the circuit comprising:
   a transformer having an input side and an output side, the input side having a first end and a second end;
   a first p-type MOSFET transistor coupled to the first end of the transformer, the first transistor being configured to provide a first signal to the first end in response to an input signal transitioning to a first state;
   a second p-type MOSFET transistor coupled to the second end of the transformer; the second transistor being configured to provide a second signal to the second end in response to the input signal transitioning to a second state;
   a third n-type MOSFET transistor coupled to the first transistor, the first and third transistors provided in a half bridge configuration;
   a fourth n-type MOSFET transistor coupled to the second transistor, the second and fourth transistors provided in a half bridge configuration;
   a first delay component coupled to the gate of the third transistor to delay the input signal by a first delay period before being applied to the gate of the third transistor, the first delay component including a resistor having a first end coupled to a first voltage source, a capacitor coupled to a second end of the resistor, and a comparator having a first input node coupled to a node between the resistor and the capacitor and a second input node coupled to a second voltage source; and
   a second delay component coupled to the gate of the fourth transistor to delay the input signal by a second delay period before being applied to the gate of the fourth transistor;
   wherein the input signal is applied to the gate of the first transistor without being inverted and the applied to the gate of the second transistor after being inverted and
   the output side is configured to output differential signals according to the first and second signals applied to the transformer.

2. The circuit of claim 1, further comprising:
   a third transistor coupled to the first transistor, the first and third transistors provided in a half bridge configuration; and
   a fourth transistor coupled to the second transistor, the second and fourth transistors provided in a half bridge configuration.

3. The circuit of claim 2, wherein the first and the second transistors are p-type MOSFETs, and the third and fourth transistors are n-type MOSFETs.

4. The circuit of claim 3, wherein the input signal is applied to the gate of the first transistor without being inverted and the applied to the gate of the second transistor after being inverted.

5. The circuit of claim 4, further comprising:
   a first delay component coupled to the gate of the third transistor to delay the input signal by a first delay period before being applied to the gate of the third transistor; and
   a second delay component coupled to the gate of the fourth transistor to delay the input signal by a second delay period before being applied to the gate of the fourth transistor.

6. The circuit of claim 1, wherein the input signal is applied to the gate of the third transistor after being inverted and applied to the gate of the fourth transistor without being inverted.

7. The circuit of claim 1, wherein the circuit is part of a gate driver.

8. The circuit of claim 7, further comprising:
   a comparator that is configured to receive the differential signals outputted on the output side of the transformer and generate a gate drive signal to drive a power device.

9. The circuit of claim 7, wherein the gate driver is a packaged gate driver that includes the transformer, the first and second transistors, and the comparator.

10. The circuit of claim 1, wherein the first transistor having one end grounded and the other end coupled to the first end of the transformer, and the second transistor having one end grounded and the other end coupled to the second end of the transformer.

11. The circuit of claim 1, wherein the circuit is configured to transmit primarily an edge transition information from the input side of the transformer to the output side of the transformer.

12. The circuit of claim 1, wherein the circuit is configured to use differential inputs to the transformer to generate the differential signals at the output side of the transformer.

* * * * *